United States Patent [19]

Hall

[11] Patent Number: 5,381,599
[45] Date of Patent: Jan. 17, 1995

[54] LIQUID CRYSTAL POLYMER ENCAPSULATED ELECTRONIC DEVICES AND METHODS OF MAKING THE SAME

[75] Inventor: Gregory L. Hall, Azle, Tex.
[73] Assignee: Delco Electronics Corp.
[21] Appl. No.: 46,009
[22] Filed: Apr. 12, 1993
[51] Int. Cl.[6] .................................... H01R 43/00
[52] U.S. Cl. ................................ 29/856; 174/52.2; 257/787
[58] Field of Search ............ 174/52.1, 52.2, 52.3, 174/52.4; 257/787, 788, 789, 790–795; 29/856, 855

[56] References Cited

U.S. PATENT DOCUMENTS

| | | | |
|---|---|---|---|
| 4,139,399 | 2/1979 | Lindmayer | 136/89 H |
| 4,480,975 | 11/1984 | Plummer et al. | 264/276 |
| 4,632,798 | 12/1986 | Eickman et al. | 264/272.13 |
| 4,701,830 | 10/1987 | Kato | 361/395 |
| 4,756,392 | 5/1988 | Hoppe | 156/244.12 |
| 4,788,583 | 11/1988 | Kawahara et al. | 357/72 |
| 4,925,266 | 5/1990 | Huebscher et al. | 350/96.20 |
| 4,965,227 | 10/1990 | Chang et al. | 437/207 |
| 4,983,713 | 1/1991 | Hayashi et al. | 528/190 |
| 4,994,895 | 2/1991 | Matsuzaki et al. | 257/791 |
| 5,085,913 | 2/1992 | Wong | 264/272.13 |
| 5,087,479 | 2/1992 | McManus et al. | 264/279.1 |
| 5,186,383 | 2/1993 | Melton et al. | 228/180.2 |
| 5,219,502 | 6/1993 | Zaidi et al. | 264/102 |
| 5,219,795 | 6/1993 | Kumai et al. | 437/211 |
| 5,223,344 | 6/1993 | Sumpter et al. | 428/447 |
| 5,251,679 | 10/1993 | Schweizer | 140/105 |

FOREIGN PATENT DOCUMENTS

| | | | |
|---|---|---|---|
| 58-10841 | 1/1983 | Japan | 257/787 |
| 4023442 | 1/1992 | Japan | 29/856 |

OTHER PUBLICATIONS

IBM Technical Disclosure R. R. Dion and J. A. Benenati vol. 7, No. 7, Dec. 1964.
IBM Technical Disclosure R. W. Nufer vol. 16 No. 9 Feb. 1974.

*Primary Examiner*—Leo P. Picard
*Assistant Examiner*—Christopher Horgan
*Attorney, Agent, or Firm*—Cary W. Brooks; Mark A. Navarre

[57] ABSTRACT

Disclosed is a high temperature, high pressure process of encapsulating electronic devices. The high pressure process is particularly suitable for encapsulating flip-chip devices wherein the collapse of flip-chip solder bumps is prevented. A special mold may be used to prevent the ceramic substrate of the flip-chip device from breaking under the high injection pressure conditions. The encapsulant is a rigid liquid crystal polymer.

4 Claims, 4 Drawing Sheets

LIQUID CRYSTAL POLYMER ENCAPSULATED ELECTRONIC DEVICES AND METHODS OF MAKING THE SAME

FIELD OF THE INVENTION

The present invention generally relates to liquid crystal polymer encapsulated electronic devices.

BACKGROUND OF THE INVENTION

"Flip-Chips" include an integrated circuit that is formed in a silicon chip. Solder bumps are formed on one face of the chip at locations on the integrated circuit where electrical connection is desired. The chip is "flipped" over and mounted by the solder bumps to a hybrid circuit formed on a ceramic substrate so that the integrated circuit side of the chip is face down. The use of flip-chips has a variety of advantages, one of which is to elevate the chip above the surface of the substrate to which it is mounted. In the elevated position, the chip operates at cooler temperatures because of improved heat dissipation. Flip-chips also eliminate potential parasitic effects associated with wire bonding of other types of chips. However, encapsulation of electronic devices having flip-chips thereon has been particularly problematic.

Maintaining the integrity of the solder bump and the level of the flip-chip above the substrate is extremely important. Encapsulation processes which involve molding a material at high temperatures around a flip-chip have heretofore been undesirable. The high temperature of such molding processes causes the solder bumps to flow often short circuiting of the hybrid circuit therefore causing the chip to fail, or causing a lop-sided elevated orientation.

Likewise, high pressure encapsulation processes for ceramic substrates have heretofore been undesirable. The conventional wisdom has been to use relatively low injection pressure in order to prevent the substrate from moving in the cavity or breaking during the encapsulation process.

Moreover, relatively rigid encapsulation materials have heretofore been undesirable. Those skilled in the art have believed that encapsulation of a hybrid circuit flip-chip device with ridged material would prevent different components of the device from expanding at different rates during thermal cycling.

Thus, it would be desirable to develop a method of encapsulating a flip-chip electronic device which does not cause the solder bumps to flow, maintains the integrity and position of the flip-chip on the device, and does not break the ceramic substrate.

SUMMARY OF THE INVENTION

Generally, the invention includes a high temperature, high pressure process of encapsulating ceramic substrate electronic devices using a special mold. The high pressure process is particularly suitable for encapsulating flip-chip devices and preventing flip-chip solder bumps from collapsing. To prevent the ceramic substrate of the flip-chip device from breaking under the high pressure injection conditions, a special mold may be used.

The encapsulant is a liquid crystal polymer which makes the flip-chip device easy to handle during subsequent preparation of an electronic device. The encapsulation can also undergo washing steps with solvents like freon or water without damage to the encapsulation material or flip-chip.

These and other objects, features, and advantages of the present invention will be apparent from the following brief description of the drawings, detailed description and appended claims and drawings.

BRIEF DESCRIPTION OF THE DRAWINGS

FIG. 5 is a sectional view taken along lines 5—5 of FIG. 4a; and

DETAILED DESCRIPTION OF THE INVENTION

Figure 1:
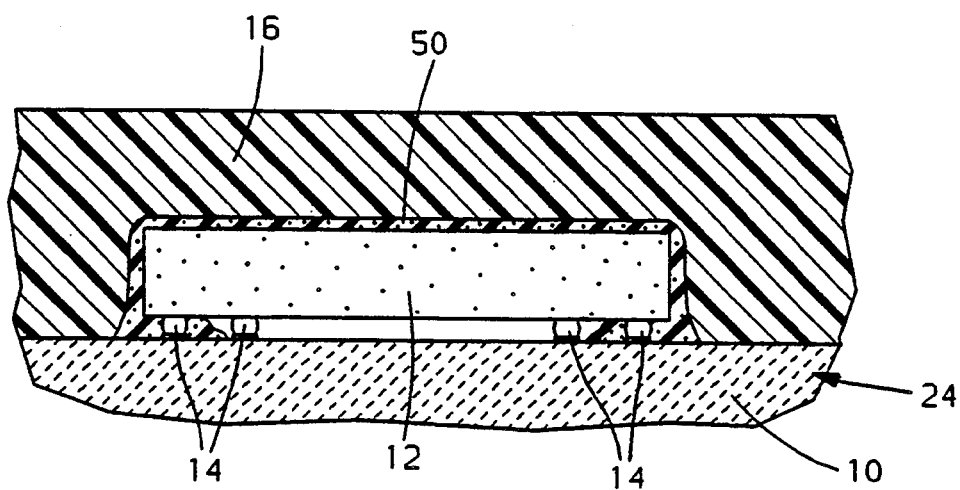
FIG. 1 illustrates in section a flip-chip positioned on a ceramic substrate.
Figure 2:
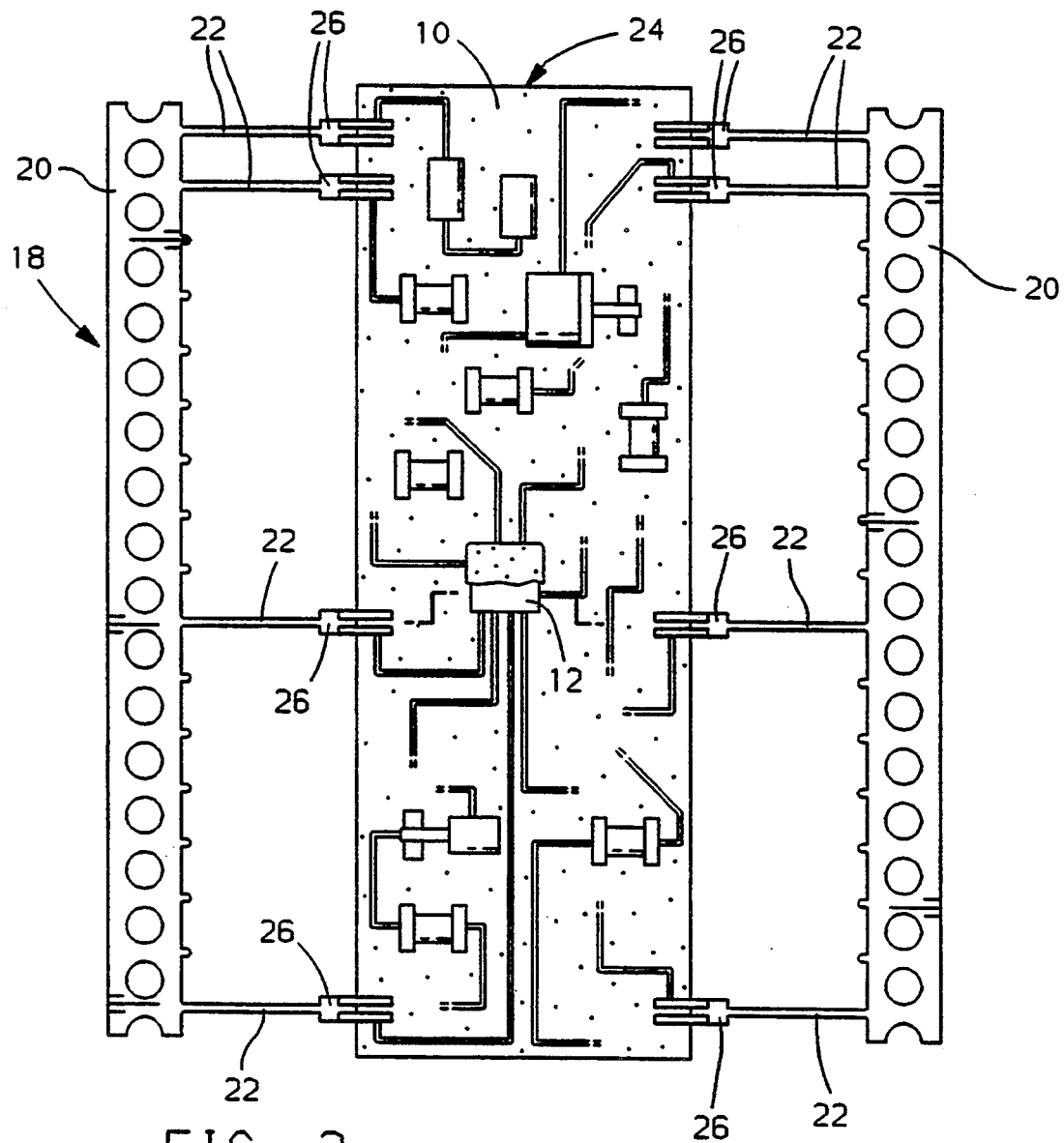
FIG. 2 illustrates an electronic device having a flip-chip thereon and having support pins and support strips attached to the substrate.
Figure 3:
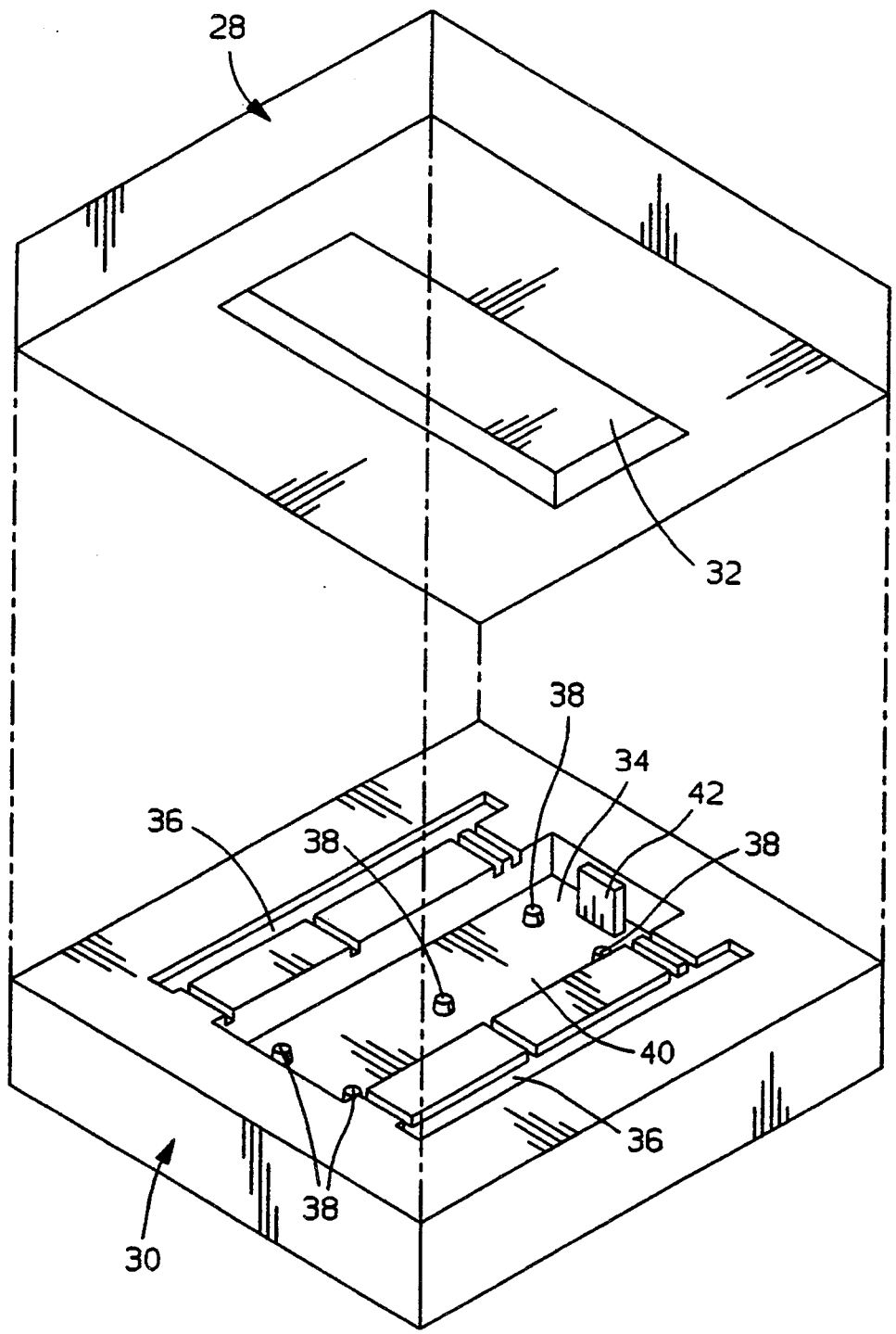
FIG. 3 is an illustration of the top shell and bottom shell of a mold for encapsulating an electronic device having a ceramic substrate according to the present invention.
Figure 4A:
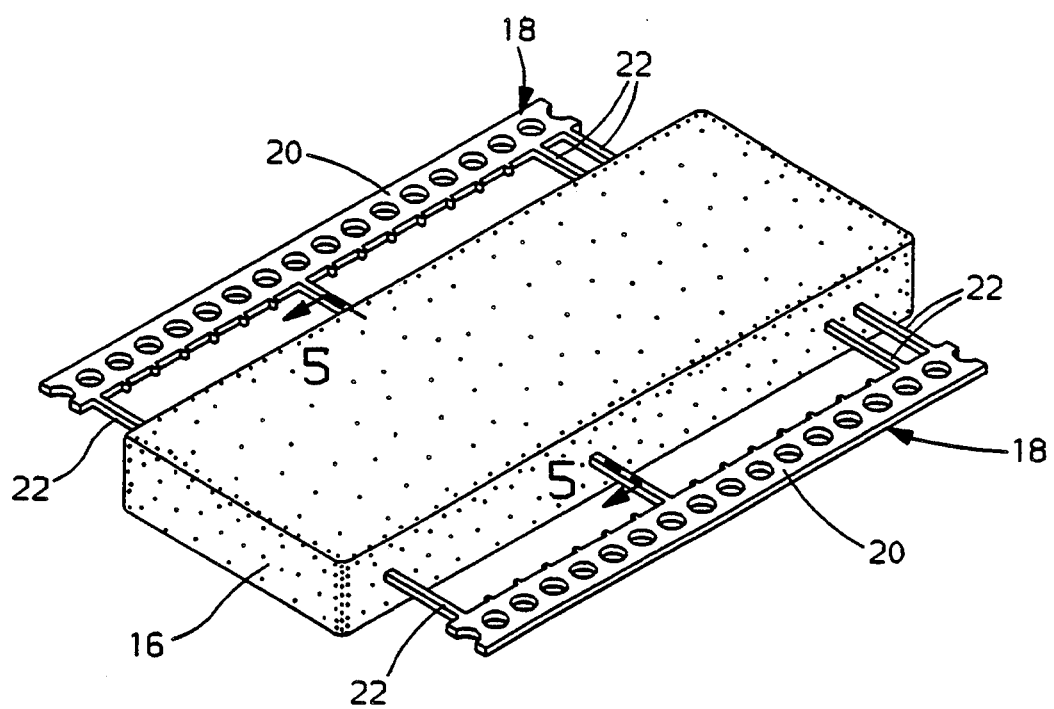
FIG. 4a is a perspective view of the top of an encapsulated electronic device using a mold according to the present invention.
Figure 4B:
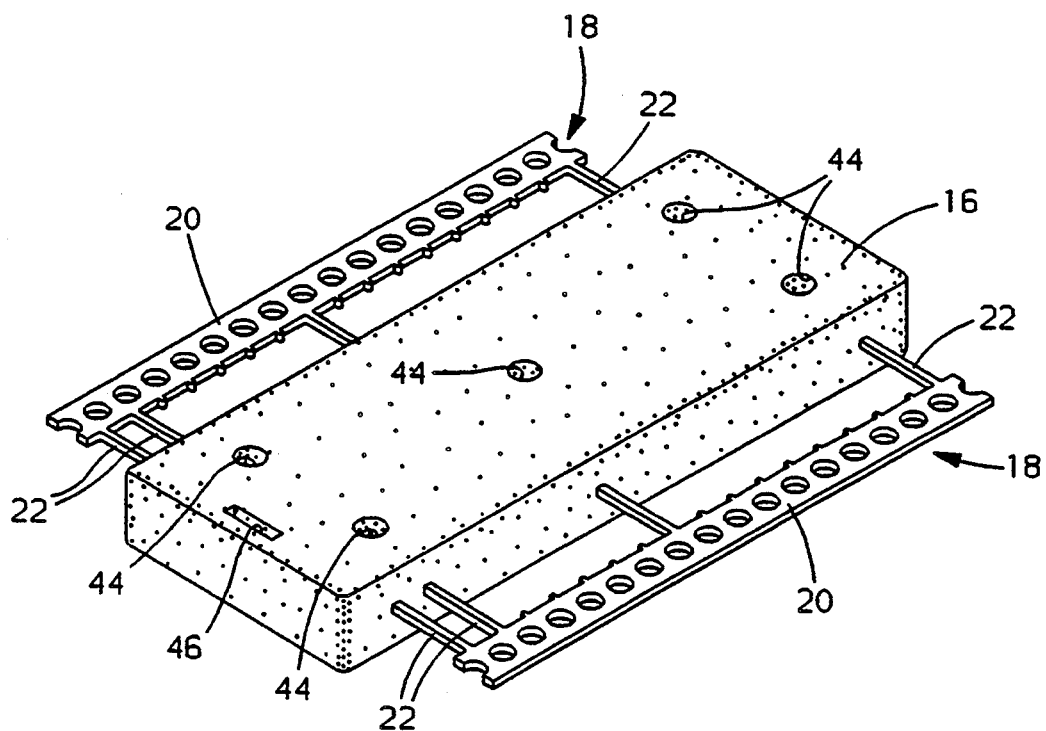
FIG. 4b is a perspective view of the bottom of an encapsulated electronic device using a mold according to the present invention.
Figure 5:
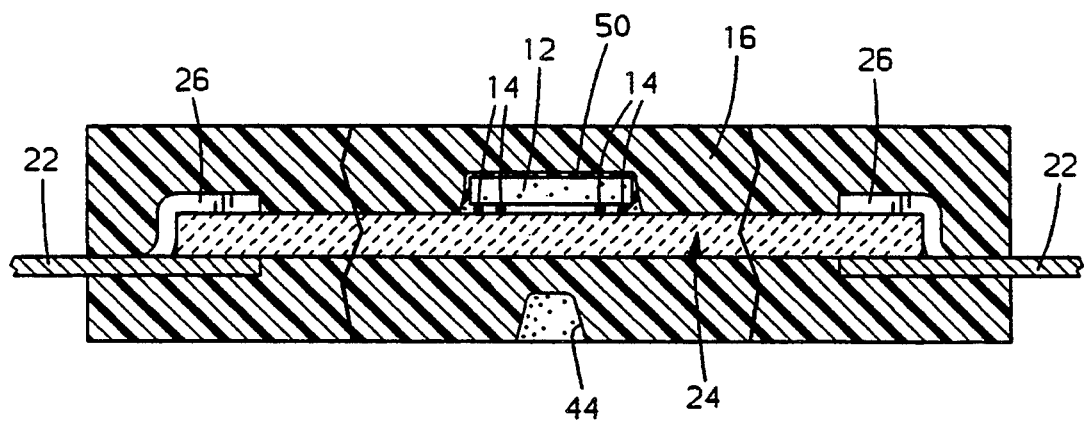

FIG. 1 illustrates an electronic device 24 including a ceramic substrate 10 having a hybrid circuit formed thereon including a flip-chip 12. Alumina is a suitable ceramic material for a substrate. The flip-chip is secured to the substrate and electronically connected to the hybrid circuit by solder bumps 14. The advantages of flip-chips in hybrid circuit devices are known to those skilled in the art. However, it is important that the flip-chip maintains its position relative to the substrate. The solder bumps should not collapse or flow, therefore causing a short in the hybrid circuit.

According to the present invention, the electronic device including a flip-chip 12 is encapsulated with a dielectric 16. A suitable encapsulating composition includes a liquid crystal polymer which may include p,p'bisphenol, p-hydroxybenzoic acid and terephthalic acid monomers. A suitable liquid crystal polymer is available from Amoco Performance Products, Inc., under the trade name XYDAR ®. The liquid crystal polymer may be injected into a mold cavity at a temperature of about 610° F. to about 710° F.

The liquid crystal polymer has very good flowability with a specific gravity of about 1.84. This allows quick injection of the polymer into the mold without damaging components. The good flowability also allows the polymer to be injected at very high temperatures and solidify before the flip-chip solder bumps flow.

The use of a liquid crystal polymer has several advantages. The liquid crystal polymer is relatively hard and rigid, having stress and thermal properties similar to metals. The liquid crystal polymer encapsulated flip-chip can be easily handled during further processing without damaging the flip-chip. The encapsulated flip-chip can be mounted on a circuit board and undergo washing step involving solvents like freon and water without damage to the encapsulation material or flip-chip. Heretofore, flip-chip devices had to be passivated after washing steps.

The device to be encapsulated may be suspended in the mold cavity with the aid of support members. A pair of support members 18 each including a support strip 20 having at least two support pins 22 extending therefrom are connected to respective sides of the electronic device 24. The electronic device is a hybrid circuit formed on the ceramic substrate 10 and includes a flip-chip 12 with solder bumps 14 bonded to electrical leads of the hybrid circuit. The support pins may be mechanically connected to the electronic device by a pressure-fitted clasp 26. Alternatively, the support pins can be bonded or welded to sides of the electronic device and may be electrically connected to the hybrid circuit. The electronic device having a flip-chip thereon and support strips are placed in a mold having top and bottom shells 28, 30. The shells each has a cavity 32, 34 for receiving the electronic device. At least one shell has a separate cavity 36 for the support strips and support pins.

However, support members by themselves are not strong enough to support the ceramic substrate in its vertical position during the high pressure injection process. A special mold is used to prevent the ceramic substrate from breaking under the high pressure injection conditions. The mold includes a plurality of pedestals 38 for supporting the substrate in position during the high pressure injection. Each pedestal extends upwardly from the bottom face 40 of the bottom shell and includes a flat foot for supporting the substrate. The flat foot has an area sufficient to support the substrate but not break the substrate during the high pressure injection. For a mold having a cavity with a length of about 1.87", width of about 0.75", and height of about 0.19", five pedestals are sufficient. The pedestals are located near each corner and in the middle of the cavity. Each pedestal has a height of about 0.125" and the foot has an area of about 0.125". The mold may also include a stop 42 for positioning the substrate during the injection step.

Figure 6:
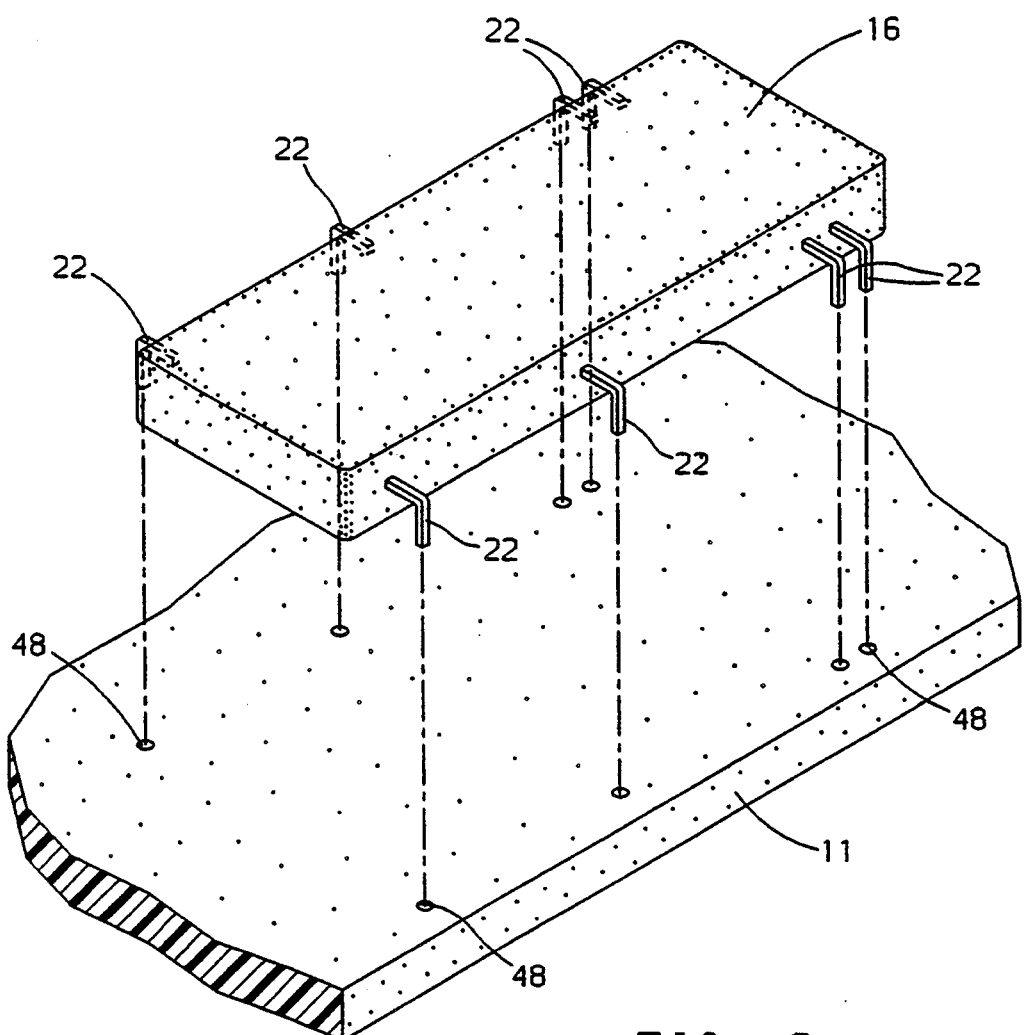
FIG. 6 is an illustration of an encapsulated electronic device secured to a substrate by support pins according to the present invention.

The liquid crystal polymer composition is injected into the mold cavity at a sufficiently high enough pressure to prevent the flip-chip solder bumps from collapsing. The composition cures to a solid protective material completely encasing the electronic device. Thereafter, the support pins may be broken off at the edge of the support strip. Alternatively, the support pins 22 may be bent and inserted into holes 48 formed in a substrate 11 (i.e., circuit board) and permanently fixed thereto by soldering, or the like, for example as illustrated in FIG. 6. At least one of the support pins provides electrical connection between the encapsulated device and the substrate 11. Further, the support pins may be pulled away from the electronic device leaving a small hole in the cured silicone material. Holes 44, 46 left by the pedestals and stop may be filled with a dielectric material.

Suitable solder bump composition are known to those skilled in the art and solder bumps formed therefrom may flow at a temperature ranging from about 170° C. to about 210° C. However, the liquid crystal polymer is injected in the mold at about 320° C. to about 377° C. The injection pressure is sufficiently high enough to quickly fill the cavity. The high-pressure liquid is believed to keep the solder in place until the liquid polymer cures to a hard mass. As the liquid polymer begins to cure, the morphous solder also cures into a hard mass, and the flip-chip is maintained in its intended position. This process prevents solder bumps from flowing and eliminates the possibility of short circuiting the integrated circuit.

Prior to encapsulating the electronic device with the liquid crystal polymer, the flip-chip and more preferably, the entire device may be encapsulated with a thin layer of an elastic dielectric silicone gel material 50. The thickness of the silicone material may range from about 0.05" to about 0.15" when cure. About 3–4 eye droplets may be used to encapsulate the flip-chip. The silicone material may be cured in an oven at a temperature ranging from about 120° C. to about 150° C.

The cured elastic silicone material is flexible enough to allow the flip-chip or the device to thermally expand during operation without breaking the flip-chip or the device, even when the device is encapsulated by a relatively rigid liquid crystal polymer. A suitable elastic dielectric silicone material is available from Dow Corning Company under the product number Q3-6635 and trade name SYLGARD ®.

I claim:

1. A process of encapsulating an electronic device comprising:
    providing a device having ceramic substrate and a hybrid circuit formed thereon including a flip-chip secured to the hybrid circuit with solder bumps having a melting temperature of about 170° C. to 210° C.;
    placing said device in the cavity of a mold;
    injecting a liquid crystal polymer encapsulation material into the cavity at a temperature ranging from about 320° C. to about 377° C., and at a sufficiently high enough pressure to solidify the encapsulating material so that the solder bumps do not flow during the injecting step.

2. A process as set forth in claim 1 wherein said liquid crystal polymer comprises p,p'bisphenol, p-hydroxybenzoic acid and terephthalic acid monomers.

3. A process as set forth in claim 1 wherein said liquid crystal polymer has a specific gravity of about 1.7 to about 1.9 at a temperature ranging from about 320° C. to about 377° C.

4. A process as set forth in claim 1 wherein said liquid crystal polymer has a thermal expansion coefficient less than said flip-chip and further comprising coating said flip-chip with an elastic dielectric gel material so that the flip-chip may expand during operation without damage to the chip.

* * * * *